US008774738B2

(12) United States Patent
Dakshinamurthy et al.

(10) Patent No.: US 8,774,738 B2
(45) Date of Patent: Jul. 8, 2014

(54) CLOSED LOOP POWER CONTROL FOR A WIRELESS TRANSMITTER

(75) Inventors: Sriraman Dakshinamurthy, San Jose, CA (US); Mohamed Mostafa, Santa Clara, CA (US); Derek Shaeffer, Redwood City, CA (US); Dennis Pu, Redwood City, CA (US); Peter Capofreddi, Pine Grove Mills, PA (US)

(73) Assignee: Broadcom Corporation, Irvine, CA (US)

( * ) Notice: Subject to any disclaimer, the term of this patent is extended or adjusted under 35 U.S.C. 154(b) by 4 days.

(21) Appl. No.: 13/452,756

(22) Filed: Apr. 20, 2012

(65) Prior Publication Data

US 2012/0270511 A1    Oct. 25, 2012

Related U.S. Application Data

(60) Provisional application No. 61/478,092, filed on Apr. 22, 2011.

(51) Int. Cl.
*H04B 17/00* (2006.01)

(52) U.S. Cl.
USPC ............... 455/115.1; 455/232.1; 455/234.1; 455/234.2; 455/240.1; 455/250.1

(58) Field of Classification Search
CPC .................. H04B 2001/0416; H04W 52/52
USPC .......... 455/115.1, 232.1, 234.1, 234.2, 240.1, 455/250.1
See application file for complete search history.

(56) References Cited

U.S. PATENT DOCUMENTS 7,945,226 B2 *   5/2011   Mak ........................... 455/232.1

* cited by examiner

*Primary Examiner* — Sanh Phu
(74) *Attorney, Agent, or Firm* — Sterne, Kessler, Goldstein & Fox PLLC

(57) ABSTRACT

Embodiments of the present disclosure provide systems and methods for estimating gain and phase error in a wireless transmitter. Embodiments of the present disclosure provide a gain and phase controller that uses a digital gain and phase estimator to jointly estimate both gain and phase. The forward and feedback signals of a wireless transmitter are digitized using analog to digital (ADC) converters. The digital signals are correlated with each other to dynamically extract gain and phase estimates of the loop. The gain and phase estimates are used to correct gain and phase errors in the wireless transmitter.

22 Claims, 13 Drawing Sheets

Improved Gain and Phase Controller 500

CLOSED LOOP POWER CONTROL FOR A WIRELESS TRANSMITTER

CROSS REFERENCE TO RELATED APPLICATIONS

This application claims the benefit of U.S. Provisional Patent Application No. 61/478,092, filed on Apr. 22, 2011, which is incorporated by reference herein in its entirety.

FIELD OF THE INVENTION

This invention relates to signal processing and more specifically to closed loop power control.

BACKGROUND OF THE INVENTION

Wireless transmitters can be used to transmit wireless signals via a wireless medium, and wireless receivers can be used to receive and recover transmitted wireless signals from the wireless medium. During transmission over the wireless medium, wireless signals may be distorted and/or otherwise degraded. This distortion and/or degradation may occur as a result of channel impairments such as noise, signal interference, intersymbol interference, co-channel interference, etc. To mitigate the effects of any actual and/or perceived channel impairments, some wireless transmitters code and/or otherwise process information contained in the transmitted wireless signals.

The structure of wireless transmitters and/or wireless transmitted signals can vary based on the wireless communication standard supported by the host wireless communications device. For example, IEEE 802.11a defines an orthogonal frequency division multiplexing (OFDM) wireless transmission protocol that comprises eight 20 MHz spaced channels in the lower band (e.g., 5.15 gigahertz to 5.35 gigahertz) and five 20 MHz spaced channels in the upper band (e.g., 5.725 gigahertz to 5.825 gigahertz). The analog and radio frequency (RF) sections of a conventional wireless transmitter include a baseband analog filter, an up-conversion mixer, a power amplifier driver (PAD), external filters, and a power amplifier (PA) capable of driving an antenna.

Measurement and control of RF power is a critical consideration when designing a wireless transmitter. Various factors, such as regulatory requirements on power transmitted, network robustness, and the need to co-exist with other wireless networks demand that there be tight control of transmitted power. Moreover, precise RF power control can result in improved spectral performance and can save cost and energy in the transmitter's power amplifier. Wireless standards such as Worldwide Interoperability for Microwave Access (WiMAX) and Long Term Evolution (LTE) require the wireless transmitter to operate at a specified transmit power (e.g., 23 dBm), with some allowance for output power variation as a function of device variation and load conditions (e.g., +/−2 dB). For device operation in the field, lower output power causes degradation of the link quality between the mobile station and the base station due to reduced signal-to-noise ratio (SNR) and hence range of operation. Conversely, if the power varies above the rated power of the PA, the signal quality is degraded due to non-linearities in the PA. Increased non-linearity causes signal degradation in error vector magnitude (EVM) which degrades link quality, or spectral emissions mask (SEM), which may result in violation of specifications (e.g., emission specifications).

The transmit power at the antenna of a wireless transmitter can vary due to several factors. For example, differences in gain among stages in a wireless transmitter can impact transmit power. While the nominal gain of each of the stages in a wireless transmitter may be known, the analog components (e.g., filters, mixers, power amplifier drivers, and power amplifiers) of the transmitter can have a significant variation in gain from part to part, and temperature effects can also impact these gain differences. RF transmitters are designed to support a span of RF frequencies (e.g., in WiMAX 2300 MHz to 2700 MHz). The gain of RF stages can vary as a function of the frequency at which the device is operated.

In addition, external filters on the board can filter out transmit noise in adjacent bands. These filters are usually designed to have a flat gain in the intended passband of operation (e.g., 2500 to 2700 MHz), while suppressing noise in the neighboring bands (e.g., 2400 to 2500 MHz). These filters have gain variation (e.g., 2 to 3 dB) due to ripple in their intended pass band. Another important factor impacting PA gain variation is the load presented by the antenna to the PA, which can vary as a function of reflections seen at the antenna. To maintain a constant output power delivered by an RF transmitter to the antenna, some conventional transmitters use a feedback loop (e.g., using a power detector circuit and/or an RF coupler to couple a fraction of the power to the input of a power detector circuit).

Conventional transmitters have several deficiencies. For example, in a conventional transmitter having a feedback loop, the power detector transfer function is dependent on the signal characteristics of the particular signal being transmitted (e.g., a QPSK signal vs. an OFDM signal), and hence the power detector needs to be characterized over a variety of signal characteristics. A short sample of the output (e.g., 5 in duration) may not have the same statistical distribution of the signal over a full transmit frame. Hence, in order to sense the average output power the PA accurately, the power detector output needs to be averaged over a substantial portion of the transmit frame. In wireless standards such as LTE, the peak to average power ratio (PAPR) of the transmit signal is different for different periods in time, within one subframe. In systems that use an OFDM-like transmit signal (e.g., WiMAX-OFDM, LTE-SCFDMA), it is also desirable to have the output power accurately regulated during a cyclic prefix of the transmit signal to avoid inter carrier interference. Similarly, phase estimation of a transmit signal can be useful for some special transmitter architectures such as the Cartesian Feedback Amplifier or an advanced transmitter that is used in an uplink beam forming system. Further limitations and disadvantages of conventional and traditional approaches will become apparent to one of skill in the art, through comparison of such systems with some aspects of the present disclosure as set forth in the remainder of the present application with reference to the drawings.

What is needed therefore are systems, apparatuses, and methods for fast and accurate gain and phase error estimation for wireless transmitters.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings.

Figure 1:
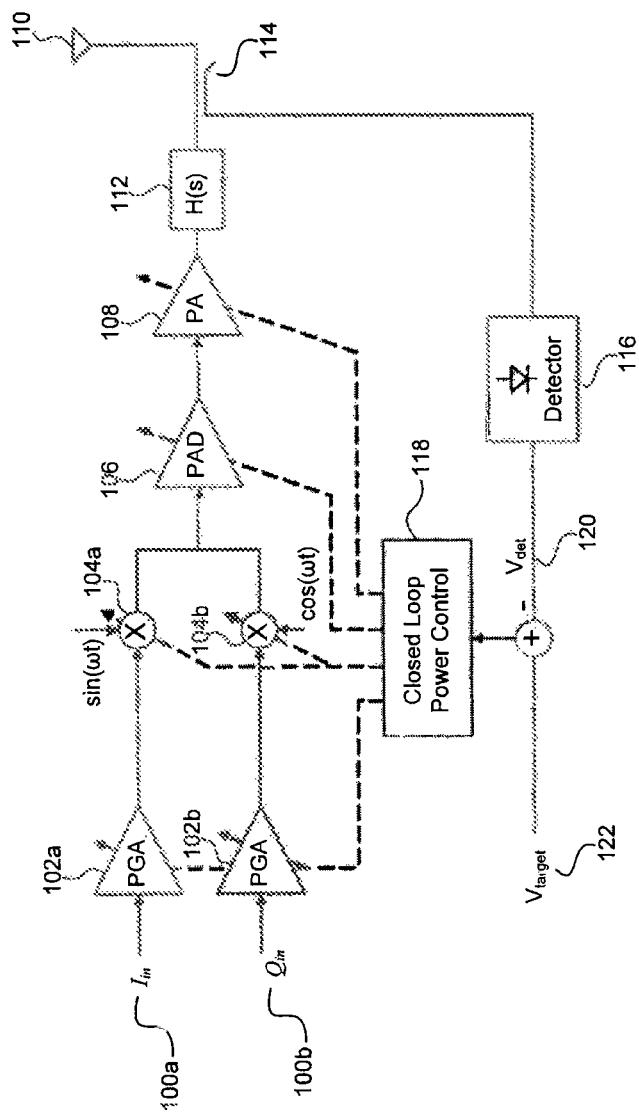
FIG. 1 is a block diagram that illustrates a closed loop power control transmitter.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

1. Overview

Embodiments of the present disclosure provide systems, apparatuses, and methods for estimating gain and phase error in a wireless transmitter. Techniques for gain and phase control in the present disclosure use a faster and more accurate technique than that employed by conventional wireless transmitters and conventional gain and/or phase controllers. A gain and phase controller in accordance with an embodiment of the present disclosure uses a digital gain and phase estimator that jointly estimates both gain and phase. This gain and phase estimator enables a more streamlined implementation of the gain and phase controller in wireless transmitters (which may optionally include a CFL). A gain and phase controller providing closed loop power control in accordance with an embodiment of the present disclosure can be implemented within a wireless transmitter that does not employ a CFL.

2. Conventional Closed Loop Power Control Transmitters

FIG. 1 is a block diagram that illustrates a conventional closed loop power control transmitter. The transmitter of FIG. 1 includes programmable gain amplifiers 102 having $I_{in}$ 100a and $Q_{in}$ 100b analog baseband signal inputs, up-conversion mixers 104, a power amplifier driver (PAD) 106, a power amplifier (PA) 108 capable of driving antenna 110, and a filter 112. (It is noted that antenna 110 could be a generic output port from the perspective of a transmitter integrated circuit or module, which is later connected to an antenna or other transducer.) A feedback mechanism (e.g., a directional coupler) can be used to sample the power sent to antenna 110. For example, in an embodiment, directional coupler 114 samples a fraction of the power sent to antenna 110, and this signal is fed to power detector 116. Detector 116 detects the fraction of the power sent to the antenna and translates the sampled power to a voltage representing this sampled power. Because coupler 114 samples a known fraction of power sent to antenna 110, the amount of power actually sent to antenna 110 can be calculated based on the fraction of power detected by detector 116. Using this information, a closed loop power control module 118 can determine how close the detected power $V_{det}$ 120 is to the target power $V_{target}$ 122. Closed loop power control module 118 can modify elements of the closed loop power control transmitter (e.g., PGAs 102, mixers 104, PAD 106, and/or PA 108) until $V_{det}$ 120 more closely matches $V_{target}$. Closed loop power control module 118 can ensure that a constant power is delivered by PA 108 to antenna 110. If power detector 116 is well characterized, the set point of the feedback loop can be chosen in order to match a desired output power at PA 108.

The transmitter of FIG. 1 has several disadvantages. For example, detector 116 is a slow, nonlinear device and is calibrated on a part by part basis. It is also difficult to manufacture (and thus can be costly) and has a small dynamic range that does not scale well (e.g., it is difficult to extend its dynamic range to the range used by 4G and 3G specifications). To get a stable reference signal representing the power sent to antenna 110, the sampled power should ideally be averaged for a relatively long period of time. A short sample of the output, for example, 5 μs in duration, may not have the same statistical distribution of the signal over a full transmit frame. Hence, in order to sense the average output power of PA 108 accurately, the output of power detector 116 needs to be averaged over a substantial portion of the transmit frame. In wireless communication standards such as LTE, the peak to average power ratio (PAPR) of the transmit signal may be different for different periods in time.

In some systems (for example, WiMAX-OFDM and LTE-SCFDMA) that use OFDM like transmit signals, it may be desirable to have the output power accurately regulated during a cyclic prefix of the transmit signal. The power detector transfer function of power detector 116 depends on the signal characteristics of the particular signal being transmitted (e.g., QPSK vs. OFDM), and hence power detector 116 needs to be characterized over a variety of signal characteristics. In OFDM-like signals, the quadrature amplitude modulation (QAM) constellation can have a very low amplitude or a very high amplitude depending on the data. Thus, power may need to be averaged over a complete subframe (e.g., 1 ms) before a reliable measurement of the output power can be obtained.

Figure 2:
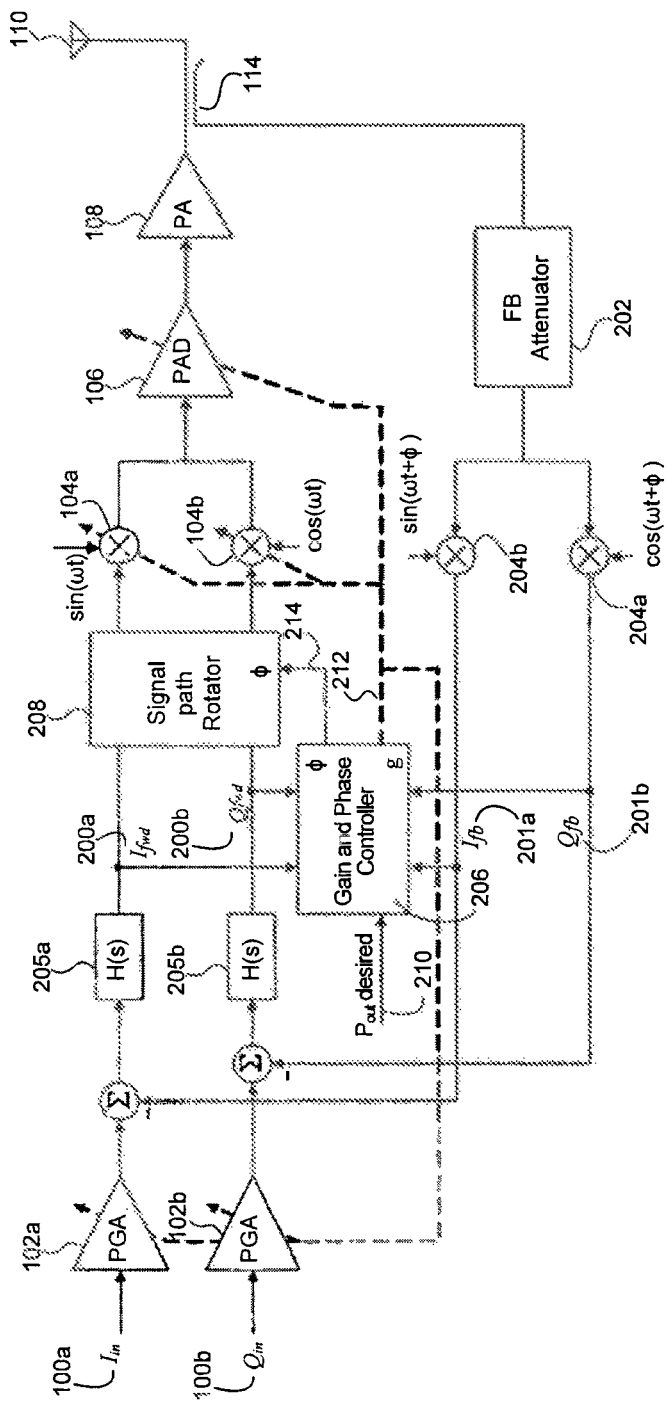
FIG. 2 is a block diagram that illustrates a Cartesian feedback loop that is utilized for a closed loop power control transmitter.

FIG. 2 shows a block diagram of a conventional wireless transmitter including a Cartesian Feedback Loop (CFL). In transmitters having CFLs, additional components are included in the feedback path. These additional components include feedback attenuator 202, down conversion mixers 204, gain and phase controller 206, and signal path rotator 208. Gain and phase controller 206 measures and regulates the total gain around the feedback loop to keep the feedback loop stable. Gain and phase controller 206 further measures and regulates the phase rotation seen around the feedback loop. The output of PA 108 is sensed as before using directional coupler 114, and then attenuated using feedback attenuator 202. Mixers 204a and 204b down-convert the feedback output of attenuator 202 in quadrature to generate down converted feedback signals $I_{fb}$ 201a and $Q_{fb}$ 201b. Gain and phase controller 206 receives an output of filters 205, represented by the transmitted signals $I_{fwd}$ 200a and $Q_{fwd}$ 200b, and compares these transmitted signals to the down converted feedback signals $I_{fb}$ 201a and $Q_{fb}$ 201b output from mixers 204. Based on this comparison, gain and phase controller 206 computes the phase rotation and gain error present in the loop, both of which can effect loop stability. Thus, gain and phase errors are ideally minimized by gain and phase controller 206.

Gain and phase controller 206 adjusts the gain and phase of various elements in the CFL by issuing gain control signals 212 and phase control commands 214. Gain and phase controller 206 can adjust the gain of various elements (e.g., PGAs 102, mixers 104, and PAD 106,) of the wireless transmitter so that the output power is closer to the desired output power indicated by $P_{out\ desired}$ 210. $P_{out\ desired}$ 210 is used as a reference value by gain and phase controller 206 to determine the difference between a desired increase in gain and the actual increase in gain present in the signal sent to antenna 110. While $P_{out\ desired}$ 210 is shown in FIG. 2 (and in other figures) as a desired reference power, it should be understood that $P_{out\ desired}$ 210 can represent other desired reference quantities in accordance with embodiments of the present disclosure. For example, in the present disclosure, $P_{out\ desired}$ 210 can also represent reference voltages, currents, amplitudes, gains, etc. For example, in an embodiment, $P_{out\ desired}$ 210 represents a desired reference increase in gain. Gain and phase controller 206 can compute a difference in output power between forward signals $I_{fwd}$ 200a and $Q_{fwd}$ 200b and feedback signals $I_{fb}$ 201a and $Q_{fb}$ 201b and can compare this actual difference in power to the desired difference in power represented by $P_{out\ desired}$ 210. Once gain and phase controller 206 has determined the power "error," it can use this information to determine an amount of necessary gain adjustment to minimize the difference between the desired increase in power and the actual increase in power. Once gain and phase controller 206 has calculated an amount of necessary gain adjustment, it can adjust the gain of various elements (e.g., PGAs 102, mixers 104, and PAD 106) of the wireless transmitter using gain control signal 212.

Gain and phase controller 206 can also issue phase control signals 214 to adjust the phase of elements in the CFL. Signal path rotator 208 receives $I_{fwd}$ 200a and $Q_{fwd}$ 200b and multiples the quadrature forward components by a rotation $e^{j\phi}$. By adjusting $e^{j\phi}$ using phase control signal 214, gain and phase controller 206 can direct the operation of signal path rotator 208, which adjusts the phase rotation of the loop to minimize phase error in the loop.

Figure 3:
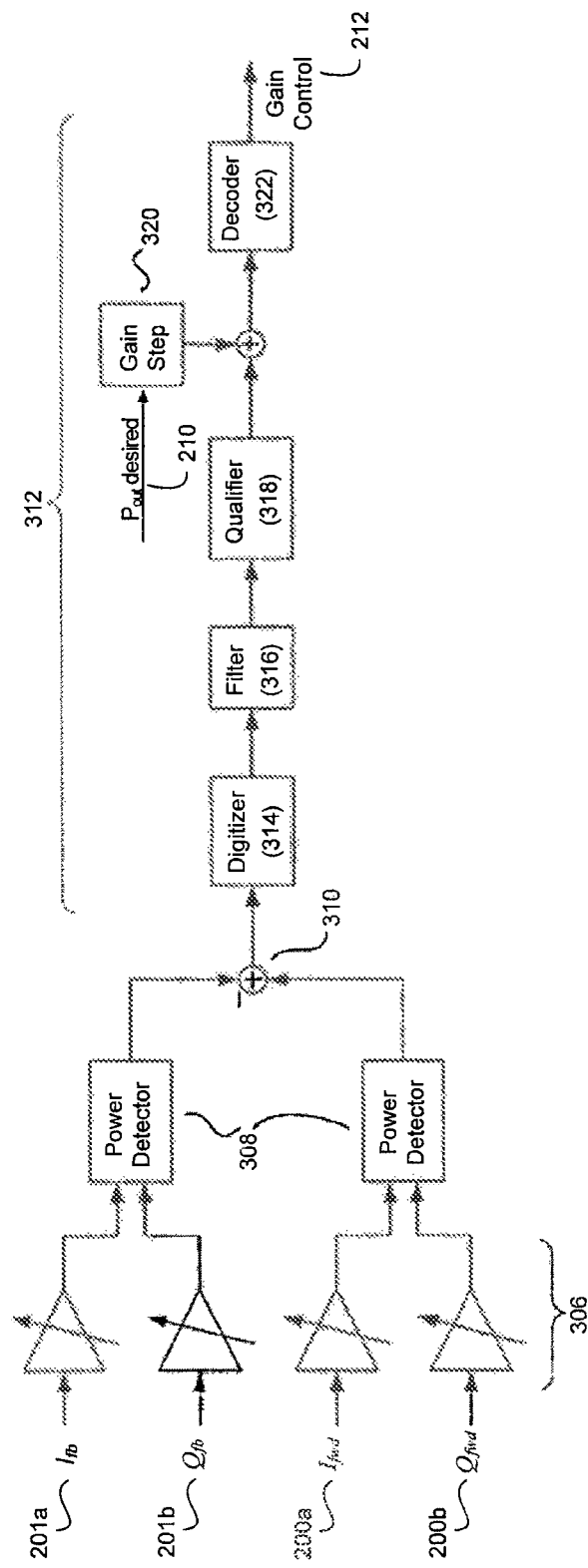
FIG. 3 is a block diagram that illustrates a gain controller that is utilized in a Cartesian feedback loop.

FIG. 3 shows a block diagram illustrating components of gain and phase controller 206 used for gain correction. FIG. 3 shows how gain and phase controller 206 calculates a necessary gain adjustment given $I_{fwd}$ 200a, $Q_{fwd}$ 200b, $I_{fb}$ 201a, and $Q_{fb}$ 201b. In FIG. 3, $I_{fwd}$ 200a, $Q_{fwd}$ 200b, $I_{fb}$ 201a, and $Q_{fb}$ 201b are amplified by amplifiers 306, and the resulting output signal is sent to power detectors 308. Power detectors 308 can be used to detect an amount of power present in forward signals $I_{fwd}$ 200a and $Q_{fwd}$ 200b and feedback signals $I_{fb}$ 201a and $Q_{fb}$ 201b. The output signals from power detectors 308 are subtracted 310 to determine a difference in power between the forward and feedback signals. A signal representing this difference in power is passed to gain controller 312, which compares this difference in power with a desired difference in power and generates gain control signal 212 based on this comparison.

Gain controller 312 includes digitizer 314, filter 316, qualifier 318, gain step module 320, and decoder 322. Gain step module 320 calculates a gain correction necessary to bring the actual output power closer to a desired output power. For example, gain step module 320 can compare the difference in forward power and feedback power sent to gain controller 312 with a desired power increase set by $P_{out\ desired}$ 210. By determining the difference between the actual power increase and the desired power increase, gain step module 320 can determine an amount of gain correction necessary to bring the actual power increase closer to the desired power increase. Gain step module 320 generates a signal representing an amount of necessary gain correction to the signal output from qualifier 318. Using the gain-corrected signal, decoder 322 can generate a control signal to adjust the gain of the CFL. Specifically, decoder 322 generates gain control signal 212, which is issued to various components of the CFL (e.g. PGAs 102, mixer 104, and PAD 106) based on the gain correction identified by the gain step module 320.

Figure 4:
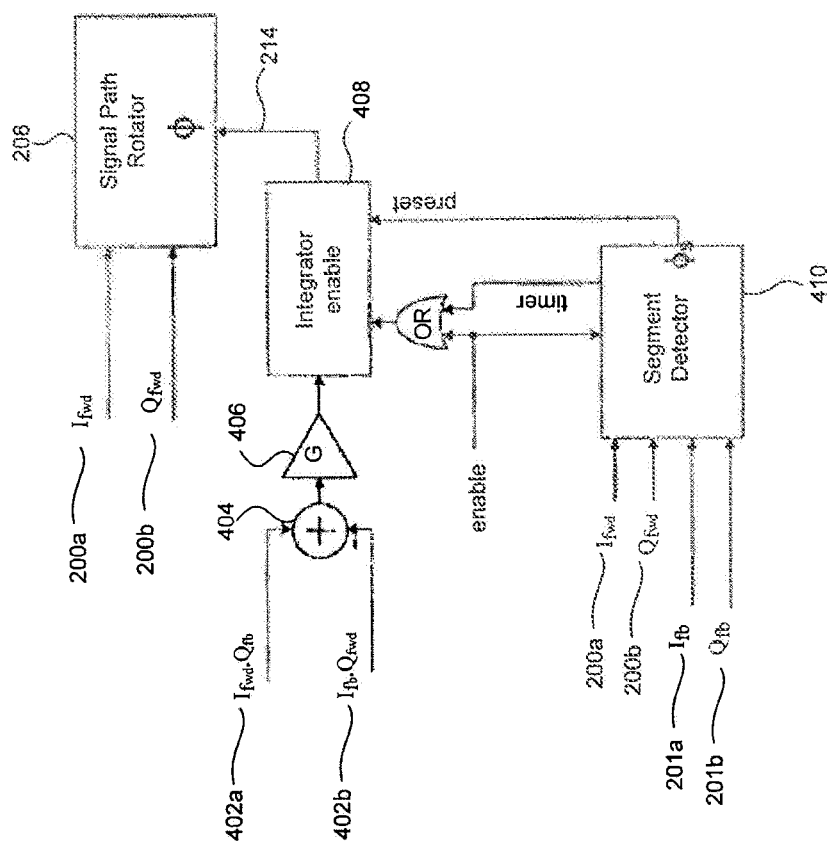
FIG. 4 is a block diagram that illustrates a phase controller that is utilized in a Cartesian feedback loop.

FIG. 4 shows a block diagram illustrating components of gain and phase controller 206 used for phase correction. FIG. 4 shows how gain and phase controller 206 calculates phase errors given $I_{fwd}$ 200a, $Q_{fwd}$ 200b, $I_{fb}$ 201a, and $Q_{fb}$ 201b. In FIG. 4, the cross product of $I_{fwd}$ and $Q_{fb}$ 402a and the cross product of $I_{fb}$ and $Q_{fwd}$ 402b are subtracted 404 to calculate the phase error $\phi$. The resulting signal is amplified by error amplifier 406. The amplified signal is passed to integrator 408. Segment detector 410 initializes integrator 408 to a known value. Using the phase error between forward and feedback signals, integrator 408 generates phase control signal 214. Integrator 408 outputs phase control signal 214 to control signal path rotator 208. Signal path rotator 208 receives $I_{fwd}$ 200a and $Q_{fwd}$ 200b and multiples the quadrature forward components by a rotation $e^{j\phi}$. By adjusting $e^{j\phi}$ using phase control signal 214, integrator 408 directs the operation of signal path rotator 208, which adjusts the phase rotation of the loop to minimize phase error in the loop.

3. New Gain and Phase Controller

Embodiments of the present disclosure provide systems, apparatuses, and methods for estimating gain and phase error in a wireless transmitter using a faster and more accurate technique than that employed by gain and phase controller 206. Further, a gain and phase controller in accordance with an embodiment of the present disclosure uses a digital gain and phase estimator that jointly estimates both gain and phase. This gain and phase joint estimator enables a more streamlined implementation of the gain and phase controller in wireless transmitters. For example, a gain and phase controller in accordance with an embodiment of the present invention eliminates the need for a signal path rotator (e.g., signal path rotator 208). Further, a gain and phase controller in accordance with an embodiment of the present disclosure can be implemented within a wireless transmitter without requiring a CFL. However, it should be understood that a gain and phase controller in accordance with embodiments of the present disclosure can also be implemented in a wireless transmitter having a CFL.

Figure 5:
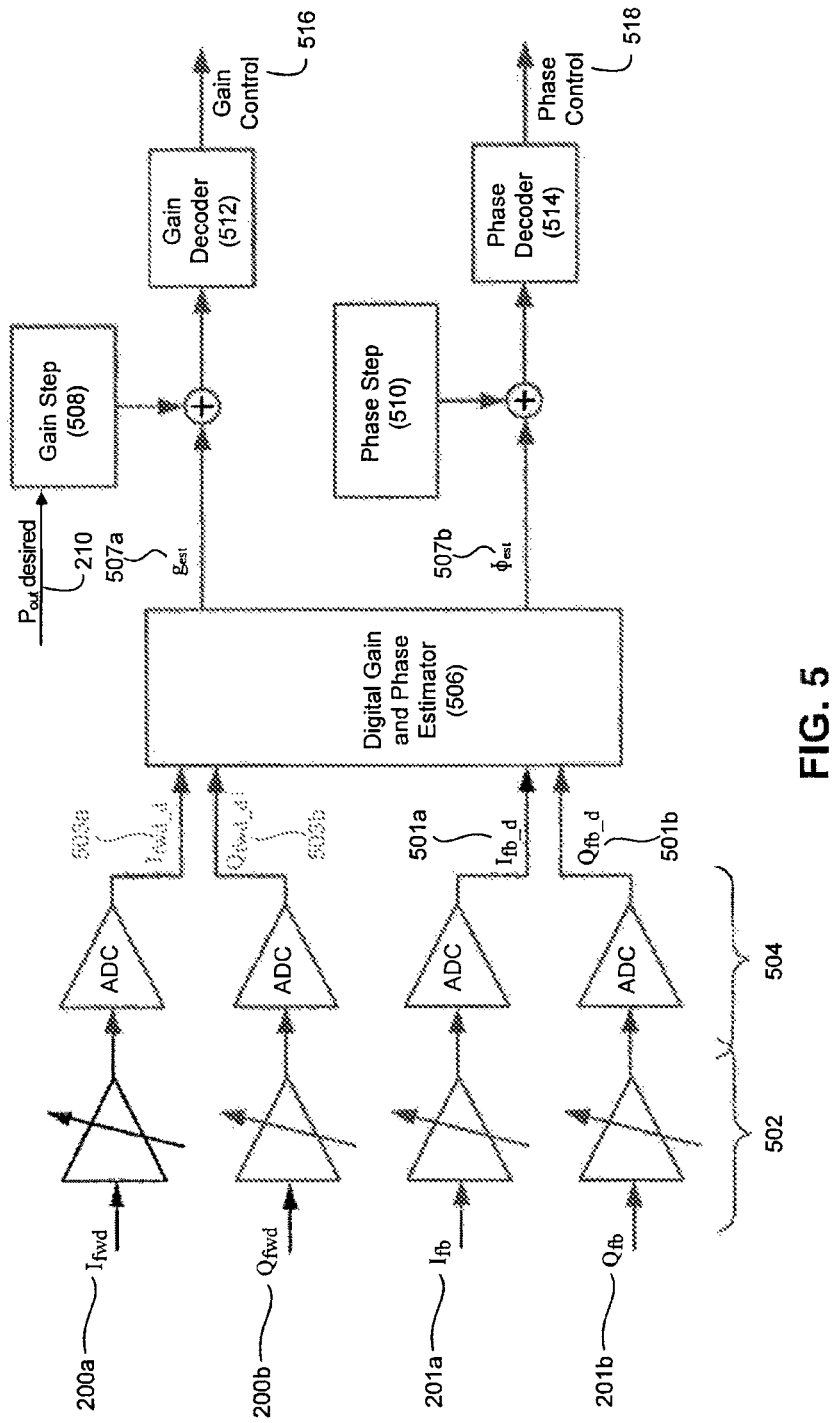
FIG. 5 is a block diagram that illustrates a joint gain and phase controller, in accordance with an embodiment of the disclosure.

FIG. 5 shows a block diagram of a fast and accurate gain and phase controller 500 in accordance with an embodiment of the present disclosure. Gain and phase controller 500 is configured to modify the gain and phase of a host circuit based on inputs $I_{fwd}$ 200a, $Q_{fwd}$ 200b, $I_{fb}$ 201a, and $Q_{fb}$ 201b. In FIG. 5, these inputs are amplified by amplifiers 502, and the resulting signals are converted to a digital format by analog to digital converters (ADCs) 504 to produce digital signals $I_{fwd\_d}$ 503a, $Q_{fwd\_d}$ 503b, $I_{fb\_d}$ 501a, and $Q_{fb\_d}$ 501b. These digital signals are input into digital gain and phase estimator module 506, which produces gain estimate 507a and phase estimate 507b. Gain estimate 507a can be used to adjust the gain of a wireless transmitter, and phase estimate 507b can be used to adjust the phase rotation of a wireless transmitter. In an embodiment, gain estimate 507a is a gain "error" representing a difference in gain between forward and feedback signals, and phase estimate 507b is a phase "error," representing a difference in phase between forward and feedback signals.

For example, gain and phase controller 500 can calculate the actual difference in between forward signals $I_{fwd}$ 200a and $Q_{fwd}$ 200b and feedback signals $I_{fb}$ 201a and $Q_{fb}$ 201b and can compensate for this error in gain as an offset to a desired output power as programmed by the input signal $P_{out\ desired}$ 210. Gain and phase controller 206 can then adjust the gain of the host circuit using gain control signal 516 so that the actual increase in gain is chosen such that the output power is close to $P_{out\ desired}$ 210. For example, in an embodiment, gain control signal 516 can be similar to gain control signal 212 in FIGS. 2 and 3. It should be understood that $P_{out\ desired}$ 210 can represent many different reference quantities in accordance with embodiments of the present disclosure. For example, in the present disclosure, $P_{out\ desired}$ 210 can represent reference voltages, currents, amplitudes, gains, etc. In accordance with embodiments of the present disclosure, gain step module 508 can be configured to generate a gain correction signal for the host circuit by comparing the desired reference quantity indicated by $P_{out\ desired}$ 210 to actual gain estimate 507a. Using this gain-corrected signal, gain decoder 512 generates gain control command 516, which is issued to various components of the host circuit to initiate a reconfiguration of these components.

Gain and phase controller 500 can also calculate phase adjustments for the host circuit using phase step module 510 so that the phase error in the host circuit is reduced. For example, in an embodiment, phase estimate 507b represents the difference in phase between forward and feedback signals (e.g., a phase error). Based on this phase difference, phase step module 510 can generate a phase correction signal. Phase decoder 514 uses this phase correction signal to generate phase control signal 518, which can be issued to various components of the host circuit to initiate a reconfiguration of these components to reduce the phase error in the host circuit.

For example, in an embodiment, phase control signal 518 can be similar to phase control signal 214 in FIGS. 2 and 4. Alternatively, if no phase correction is needed in the host circuit (e.g., if the host circuit does not employ a CFL), phase control signal 518 can be used by gain and phase controller 500 for other purposes. For example, in an embodiment, phase control signal 518 can be used by software for beamforming, measurement, etc.

Figure 6:
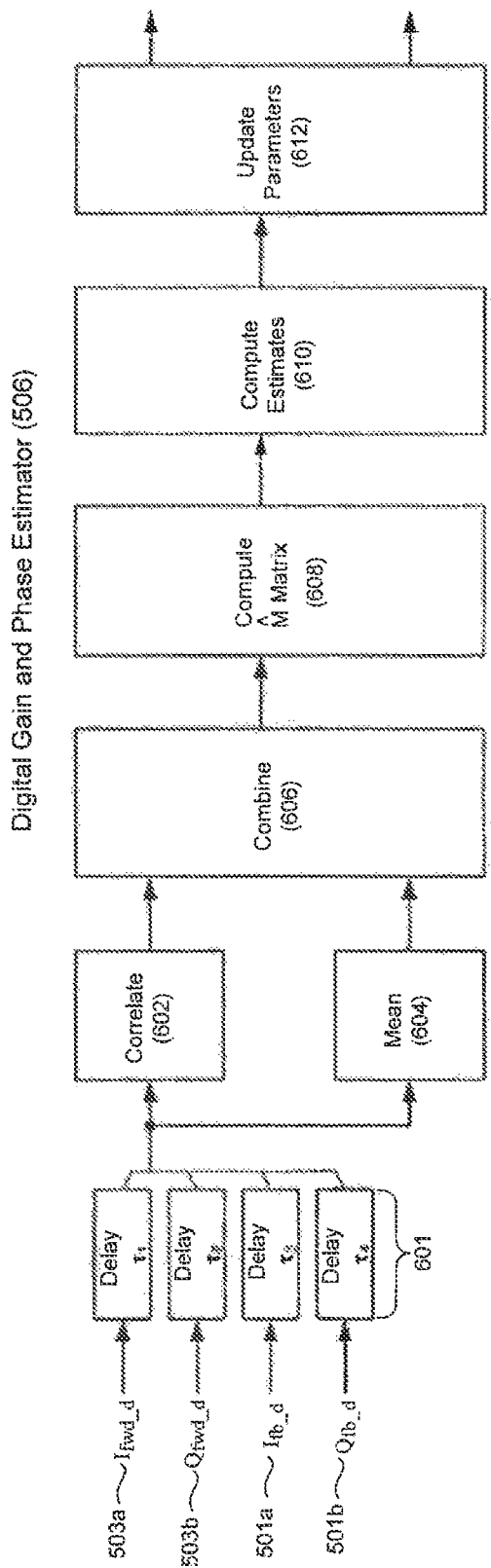
FIG. 6 is a block diagram that illustrates a gain and phase estimator, in accordance with an embodiment of the disclosure.

FIG. 6 is a block diagram showing components of digital gain and phase estimator 506 in accordance with an embodiment of the present disclosure. Digital gain and phase estimator 506 computes gain estimate 507a and phase estimate 507b based on digital input signals $I_{fwd\_d}$ 503a, $Q_{fwd\_d}$ 503b, $I_{fb\_d}$ 501a, and $Q_{fb\_d}$ 501b. Digital gain and phase estimator 506 estimates impairments introduced into the feedback loop of the wireless transmitter as a combination of gain (g), phase ($\phi$), gain mismatch (gm) and quadrature (q$\phi$) errors. These impairments can be expressed by equation (1) below.

$$\begin{bmatrix} Yi \\ Yq \end{bmatrix} = g \cdot \begin{bmatrix} \cos(\varphi) & \sin(\varphi) \\ -\sin(\varphi) & \cos(\varphi) \end{bmatrix} \cdot \begin{bmatrix} \cos(q\varphi) & \sin(q\varphi) \\ \sin(q\varphi) & \cos(q\varphi) \end{bmatrix} \cdot \\ \begin{bmatrix} 1 & 0 \\ 0 & gm \end{bmatrix} \cdot \left[ \sqrt{\frac{2}{1+gm^2}} \right] \cdot \begin{bmatrix} Xi \\ Xq \end{bmatrix} + \begin{bmatrix} Oi \\ Oq \end{bmatrix} \quad (1)$$

In equation (1), {Xi, Xq} represent forward path signals $I_{fwd\_d}$ 503a and $Q_{fwd\_d}$ 503b. {Yi, Yq} represent feedback path signals $I_{fb\_d}$ 501a and $Q_{fb\_d}$ 501b. {Oi, Oq} are the output referred direct current (DC) offset components. The coefficient of forward path signals {Xi, Xq} can be expressed as a single 2×2 "impairment matrix" M in equation (2) below.

$$\begin{bmatrix} Yi \\ Yq \end{bmatrix} = \begin{bmatrix} m_{11} & m_{12} \\ m_{21} & m_{22} \end{bmatrix} \cdot \begin{bmatrix} Xi \\ Xq \end{bmatrix} + \begin{bmatrix} Oi \\ Oq \end{bmatrix} \quad (2)$$

Equation 2 can also be expressed as Y=M·X+O. In an embodiment, N samples of forward path signals {Xi, Xq} and feedback path signals {Yi, Yq} can be taken. By averaging these N samples, equation (2) can be used to derive the expression $\overline{Y}$=M·$\overline{X}$+O, which represents the average of the feedback path signals Y in terms of the impairment matrix M, the average of the forward path signals $\overline{X}$, and DC offset O. By using equation (2) and the expression $\overline{Y}$=M·$\overline{X}$+O, the DC offset O can be removed to yield the expression (Y−$\overline{Y}$)=M·(X−$\overline{X}$).

3.1 Estimation of Impairment Matrix

In an embodiment, digital gain and phase estimator 506 computes gain estimate 507a and phase estimate 507b by estimating impairment matrix M. In an embodiment, digital input signals $I_{fwd\_d}$ 503a, $Q_{fwd\_d}$ 503b, $I_{fb\_d}$ 501a, and $Q_{fb\_d}$ 501b can first be sent through a programmable delay element 601. The delay introduced by programmable delay element 601 can be used to compensate for any systematic delays caused by baseband or analog RF filters. For example, there may be a skew between the I to Q channels that can be corrected by programmable delay element 601. Additionally, the feedback path may be delayed with reference to the forward signal, and programmable delay element 601 may be used to compensate for this delay. The resulting group of time aligned signals are then correlated by correlation module 602 and averaged over a short time period of 1 μs by mean module 604.

The general form of the impairment matrix M can be estimated using an average of N samples of forward path signals X and feedback path signals Y and the self and cross correlation terms between complex signals X and Y. In an embodiment, correlation module 602 generates correlation values cross-correlation matrix YTX and self-correlation matrix XTX using equations (3) and (4) below.

$$YTX = \Sigma Y \cdot X^T \quad (3)$$

$$XTX = \Sigma X \cdot X^t \quad (4)$$

In an embodiment, mean module 604 generates "mean" (e.g., using a running sum) matrices SY and SX by performing the operations given by equations (5) and (6) on samples of forward path signals {Xi, Xq} 503a and 503b and feedback path signals {Yi, Yq} 501a and 501b.

$$SY = \Sigma Y \quad (5)$$

$$SX = \Sigma X \quad (6)$$

The outputs of correlation module 602 and mean module 604 are combined by combination module 606. In an embodiment, the output of combination module 606 can be expressed by equations (7) and (8) below for combination matrices CYTX and CXTX.

$$CYTX = \sum (Y - \overline{Y}) \cdot (X - \overline{X})^T = YTX - \frac{SY \cdot SX^T}{N} \quad (7)$$

$$CXTX = \sum (X - \overline{X}) \cdot (X - \overline{X})^T = XTX - \frac{SX \cdot SX^T}{N} \quad (8)$$

Impairment computation module 608 computes impairments introduced into the feedback loop of the wireless transmitter. For example, in an embodiment, impairment computation module 608 computes an estimate $\hat{M}$ of impairment matrix M using the combined information from equations (7) and (8). Estimated impairment matrix $\hat{M}$ represents an estimate of the impairments introduced into the feedback loop of the wireless transmitter as a combination of gain (g), phase ($\phi$), gain mismatch (gm) and quadrature (q$\phi$) errors. In an embodiment, estimated impairment matrix $\hat{M}$ can be computed by equation (9) below.

$$\hat{M} = CYTX \cdot CXTX^{-1} \quad (9)$$

Using equations (3) through (9), an estimate $\hat{M}$ of impairment matrix M given in equation (2) can be calculated. Once this estimate $\hat{M}$ is known, estimates for gain (g), and phase ($\phi$) errors can be computed by parameter estimate computation module 610. In an embodiment, gain mismatch (gm) and quadrature (q$\phi$) errors can also be computed by parameter estimate computation module 610. For example, impairment matrix M is the coefficient of {Xi, Xq} in equation (1). Thus, estimates for the variables g, gm, $\phi$, and q$\phi$ in equation (1) can be obtained using the estimate $\hat{M}$ of impairment matrix M. Parameter update module 612 produces gain estimate signal 507a and phase estimate signal 507b using these calculated estimates. Estimates for gain (g), phase ($\phi$), gain mismatch (gm) and quadrature (q$\phi$) errors can be calculated in a number of ways. For example, in accordance with an embodiment of the present disclosure, a more accurate calculation method may be used or an approximate calculation method may be used.

3.2 More Accurate Calculation of Parameters

In an embodiment, digital gain and phase estimator 506 computes more accurate estimates for gain (g), phase ($\phi$), gain mismatch (gm) and quadrature (q$\phi$) errors. The elements of impairment matrix M in equation (2) can be represented by equations (10) through (13) below.

$$m_{11} = g \cdot \sqrt{\frac{2}{1 + gm^2}} \cdot \cos(q\varphi - \varphi) \quad (10)$$

$$m_{12} = g \cdot \sqrt{\frac{2 \cdot gm^2}{1 + gm^2}} \cdot \sin(\varphi + q\varphi) \quad (11)$$

$$m_{21} = g \cdot \sqrt{\frac{2 \cdot gm^2}{1 + gm^2}} \cdot \sin(q\varphi - \varphi) \quad (12)$$

$$m_{22} = g \cdot \sqrt{\frac{2}{1 + gm^2}} \cdot \cos(\varphi + q\varphi) \quad (13)$$

Equations (10) through (13) provide four equations for four unknown quantities—gain (g), phase ($\phi$), gain mismatch (gm) and quadrature (q$\phi$) errors. Equations (10) through (13) can be used to derive equations (14) through (17), which provide equations for gain (g), phase ($\phi$), gain mismatch (gm) and quadrature (q$\phi$) errors in terms of the elements of impairment matrix M. Since estimates for the elements of impairment matrix M have been computed using equation (9), estimates for gain (g), phase ($\phi$), gain mismatch (gm) and quadrature (q$\phi$) errors can be computed using equations (14) through (17).

$$g = \sqrt{\frac{m_{11}^2 + m_{12}^2 + m_{21}^2 + m_{22}^2}{2}} \quad (14)$$

$$\varphi = \frac{\text{angle}(m_{11} - j \cdot m_{21}) + \text{angle}(m_{22} + j \cdot m_{12})}{2} \quad (15)$$

$$q\varphi = \frac{-\text{angle}(m_{11} - j \cdot m_{21}) + \text{angle}(m_{22} + j \cdot m_{12})}{2} \quad (16)$$

$$gm = \frac{\sqrt{m_{11}^2 + m_{21}^2}}{\sqrt{m_{22}^2 + m_{12}^2}} \quad (17)$$

3.3 Approximate Calculation of Parameters

In an embodiment, digital gain and phase estimator 506 computes approximate estimates for gain (g) and phase ($\phi$) errors instead of using the more accurate method shown above. This approximate method eliminates gain mismatch (gm) and quadrature (q$\phi$) errors. For example, this approximate method may be used when equation (9) cannot be used because matrix CXTX from equation (8) is not invertible. To determine if matrix CXTX is not invertible, the determinant of the self-correlation matrix XTX from equation (4) can be calculated. If the determinant is 0, then matrices XTX and CXTX are not invertible, and the approximate method should be used. According to this approximate method, feedback path signals {Yi, Yq} 501a and 501b and forward path signals {Xi, Xq} 503a and 503b can be given by equations (18) and (19) below.

$$\begin{bmatrix} Yi \\ Yq \end{bmatrix} = g \cdot \begin{bmatrix} \cos(\varphi) & \sin(\varphi) \\ -\sin(\varphi) & \cos(\varphi) \end{bmatrix} \cdot \begin{bmatrix} Xi \\ Xq \end{bmatrix} + \begin{bmatrix} Oi \\ Oq \end{bmatrix} \quad (18)$$

$$\begin{bmatrix} Yi \\ Yq \end{bmatrix} = \begin{bmatrix} m_{11} & m_{12} \\ m_{21} & m_{22} \end{bmatrix} \cdot \begin{bmatrix} Xi \\ Xq \end{bmatrix} + \begin{bmatrix} Oi \\ Oq \end{bmatrix} \quad (19)$$

Using equations (3) through (8), values for the elements of impairment matrix M from equation (19) can be represented by equations (20) and (21) below.

$$m_{11} = m_{22} = \frac{CYTX_{11} + CYTX_{22}}{CXTX_{11} + CXTX_{22}} \quad (20)$$

$$m_{12} = -1 * m_{21} = \frac{CYTX_{12} - CYTX_{21}}{CXTX_{11} + CXTX_{22}} \quad (21)$$

Using equations (20) and (21), equations (22) and (23) for estimates for gain and phase error can be derived.

$$\hat{g} = \sqrt{\frac{m_{11}^2 + m_{12}^2 + m_{21}^2 + m_{22}^2}{2}} \quad (22)$$

$$\hat{\phi} = \frac{\text{angle}(m_{11} - j \cdot m_{21}) + \text{angle}(m_{22} + j \cdot m_{12})}{2} \quad (23)$$

In the approximate algorithm, the term $CXTX_{11}+CXTX_{22}$ is equal to $(X_i^2-\overline{X}_i^2)+(X_q^2-\overline{X}_q^2)$ and represents the power of the AC components of X. This algorithm can be especially useful to obtain reliable gain and phase estimates for sinusoidal inputs.

4. Gain and Phase Controller Implementations

Figure 7:
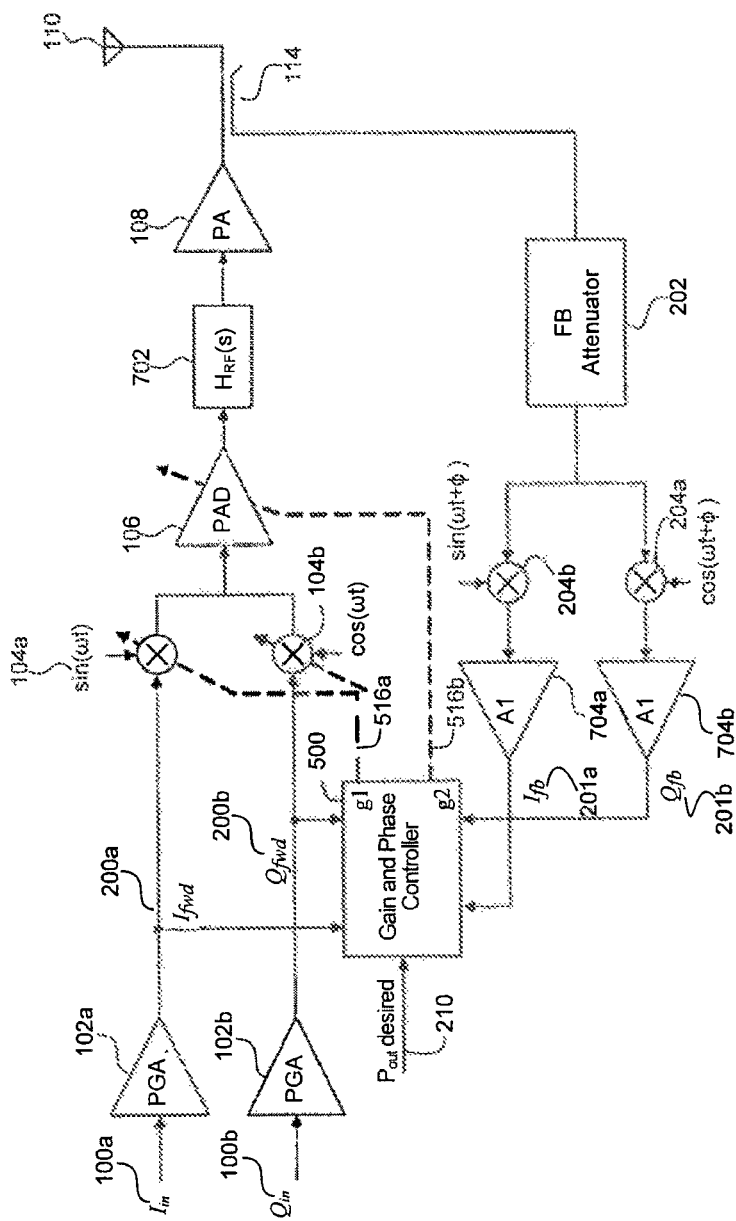
FIG. 7 is a block diagram that illustrates a closed loop power control with a RF feedback path, in accordance with an embodiment of the disclosure.

If hardware for the more accurate method is already implemented in a host circuit, hardware for the approximate method can also be implemented with a minimal amount of additional hardware. Hence, in an embodiment, both methods to compute the impairment matrix can be processed in parallel, and either the accurate method or the approximate method can be chosen based on the situation. In an embodiment, shared hardware can be used for computation of gain and phase from the impairment matrix for the accurate method and the approximate method In an embodiment, gain and phase controller 500 and digital gain and phase estimator 506 can be implemented in a wireless transmitter. Any communications device can be used to host the wireless transmitter and gain and phase estimator 506. In an embodiment, the communications device hosting wireless transmitter and gain and phase estimator 506 is a cellular phone. FIG. 7 shows a diagram of a wireless transmitter including gain and phase controller 500 for accomplishing closed loop power control without the use of CFL. As previously discussed, CFLs are sensitive to delays and are not easily modified to introduce additional elements that might cause unwanted delay. The joint gain and phase estimation architecture provided by gain and phase controller 500 can be used to provide fast and accurate closed loop power control for a wireless transmitter without requiring the implementation of a CFL. Because gain and phase controller 500 provides closed loop power control for the wireless transmitter of FIG. 7 without requiring a CFL, the wireless transmitter of FIG. 7 can be modified to include a an optional external RF filter 702. For example, the RF filter 702 can be advantageous for controlling the output frequency spectrum of transmitted signals so as to conform with standards requirements.

As previously discussed, gain and phase controller 500 receives signals $I_{fwd}$ 200a, $Q_{fwd}$ 200b, $I_{fb}$ 201a, and $Q_{fb}$ 201b. In an embodiment, $I_{fb}$ 201a and $Q_{fb}$ 201b can be amplified by amplifiers 704 before being transmitted to gain and phase controller 500. Gain and phase controller 500 uses gain control signal 516 to reconfigure elements of the wireless transmitter of FIG. 7. For example, gain and phase controller 500 can adjust the value of PAD 106 using gain control signal 516b and can adjust the gain of mixers 104 using gain control signal 516a. Further, it should be understood that while separate signals 516a and 516b for gain control are shown in FIG. 7, gain and phase controller 500 can be configured to generate a single signal capable of instructing elements of a host circuit to modify gain (and/or phase).

Figure 8:
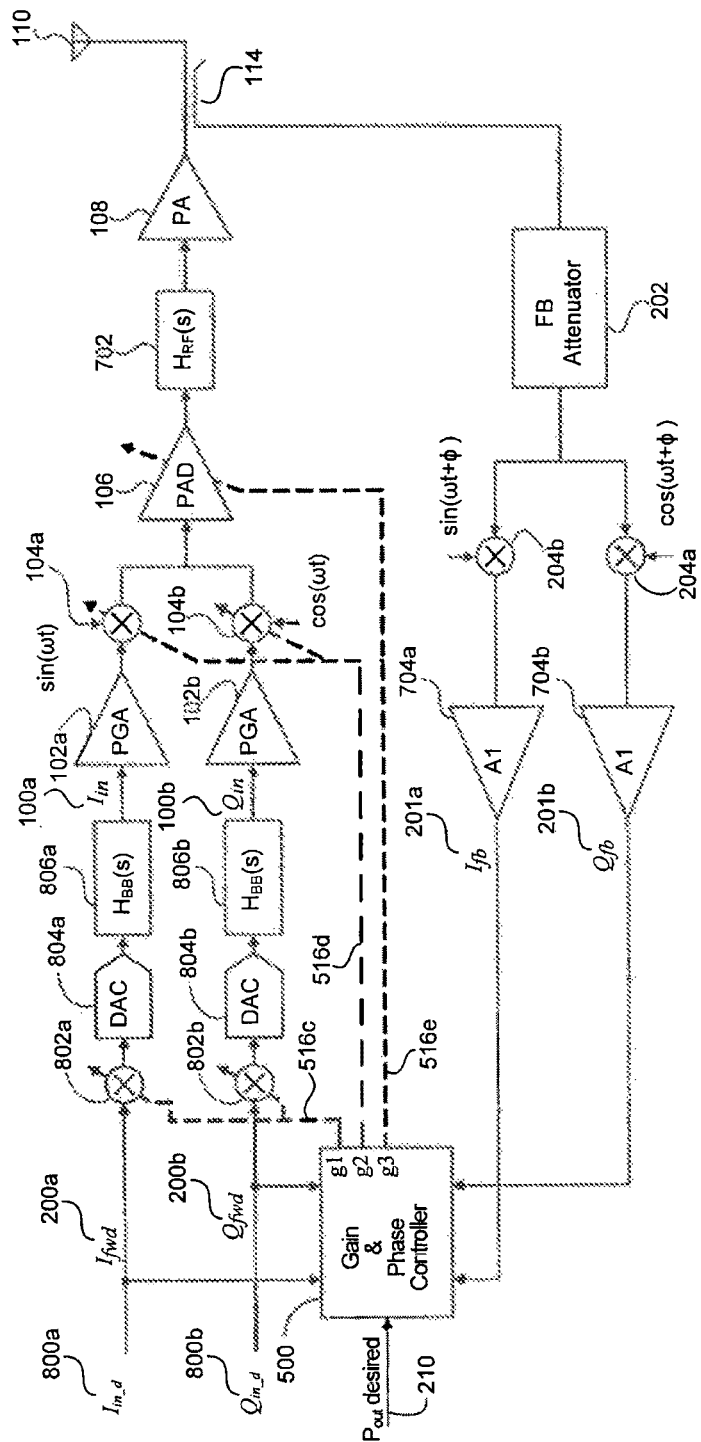
FIG. 8 is a block diagram that illustrates another closed loop power control with a RF feedback path, in accordance with an embodiment of the disclosure.

FIG. 8 is a diagram of another wireless transmitter in accordance with an embodiment of the present disclosure. In FIG. 8, additional circuitry is included in the wireless transmitter to enable gain and phase controller 500 to sample $I_{fwd\_d}$ 503a and $Q_{fwd\_d}$ 503b in digital format. This additional circuitry includes digital multipliers 802, DACs 804, and baseband filters 806. Gain and phase controller 500 is configured to sample $I_{fwd\_d}$ 503a and $Q_{fwd\_d}$ 503b before these signals are converted into analog format by DACs 804. For example, in FIG. 5, $I_{fwd\_d}$ 503a and $Q_{fwd\_d}$ 503b are samples of digital input signals $I_{in\_d}$ 800a and $Q_{in\_d}$ 800b. Gain and phase controller 500 is configured to generate both analog and digital gain control signals 516. For example, in an embodiment, gain and phase controller 500 splits a control signal into one or more digital components and one or more analog components. In FIG. 8, the digital component 516c is supplied to digital multipliers 802 before the output from digital multipliers 802 is converted into analog form by DACs 804. The analog components 516d are supplied to mixers 104 and to PAD 106. For example, these three gain signals can be calculated such that the total gain error "g" can be realized as g=g1*f(g2)*f(g3), where g1 is the gain of digital multipliers 802, f(g2) is the transfer function of the gain knob for the mixers 104, and f(g3) is the transfer function of the gain control knob for PAD 106.

Figure 9:
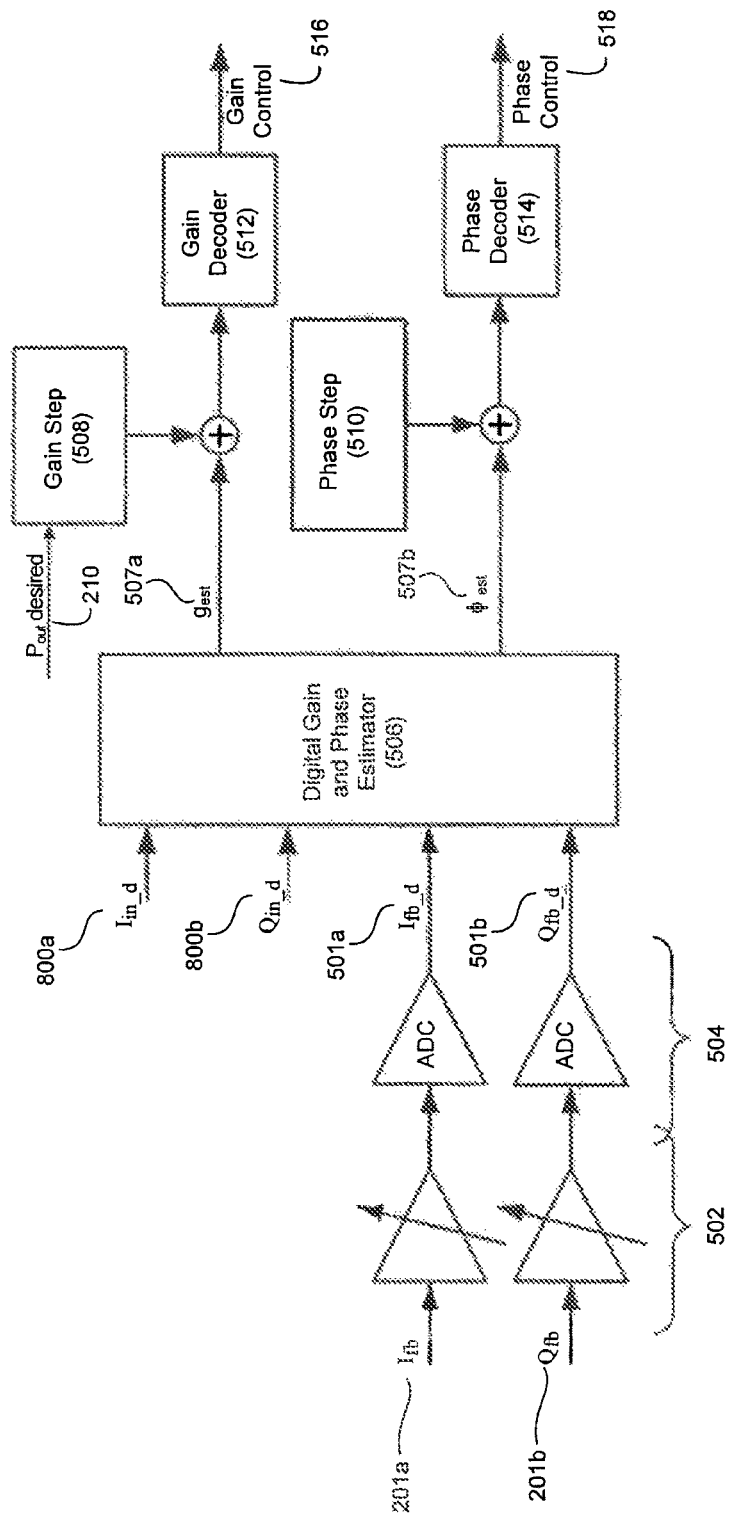
FIG. 9 is a block diagram that illustrates a modified gain and phase controller, in accordance with an embodiment of the disclosure.

FIG. 9 is a block diagram that illustrates a modified gain and phase controller 900 utilized in a wireless transmitter for closed loop power control in accordance with an embodiment of the present disclosure. In FIG. 9, only values for $I_{fb\_d}$ 501a and $Q_{fb\_d}$ 501b are converted into digital format by ADCs 504. For example, if gain and phase controller 500 is configured to generate digital and analog gain and phase control signals, as shown in FIG. 8, $I_{in\_d}$ 800a and $Q_{in\_d}$ 800b do not need to be converted into digital format because these signals are sampled before they are input into DACs 804. The implementation of FIGS. 8 and 9 can be used to reduce circuitry (e.g., the implementation of FIGS. 8 and 9 can save two amplifiers and two ADCs by using digital inputs for $I_{in\_d}$ 800a and $Q_{in\_d}$ 800b).

Figure 10:
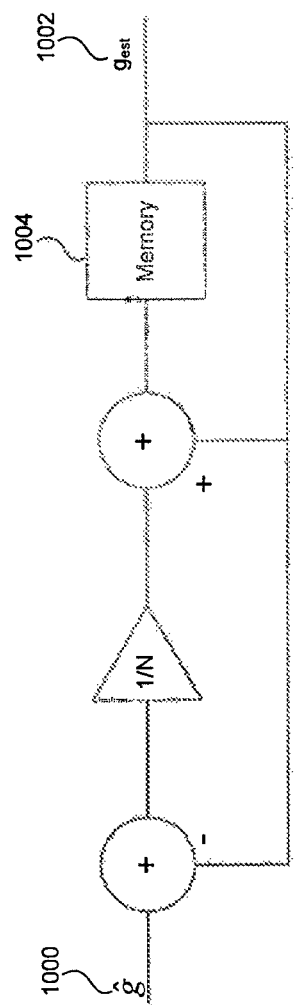
FIG. 10 is a block diagram illustrating an integrator for gain and phase estimation in accordance with an embodiment of the present disclosure.

FIG. 10 is a block diagram illustrating an integrator for gain and phase estimation in accordance with an embodiment of the present disclosure. In an embodiment of the present disclosure, gain and phase estimates can be averaged using an integrator to improve the quality of the gain and phase estimates used to generate gain and phase control signals 516 and 518. Averaging N samples can improve the variance among samples by a factor of $\sqrt{N}$. The integrator of FIG. 10 produces averaged gain estimate 1002 based on gain samples 1000. Memory 1004 is used to store data as the N samples are averaged. A generic integrator for the estimates may be expressed using the following set of equations:

$$g_{est}[n] = \frac{1}{n}\sum_{i=1}^{n} \hat{g}[i]$$

$$g_{est}[n-1] = \frac{1}{n-1}\sum_{i=1}^{n-1} \hat{g}[i]$$

$$g_{est}[n] = g_{est}[n-1] + \frac{1}{n} \cdot (\hat{g}[n] - g_{est}[n-1])$$

Figure 11:
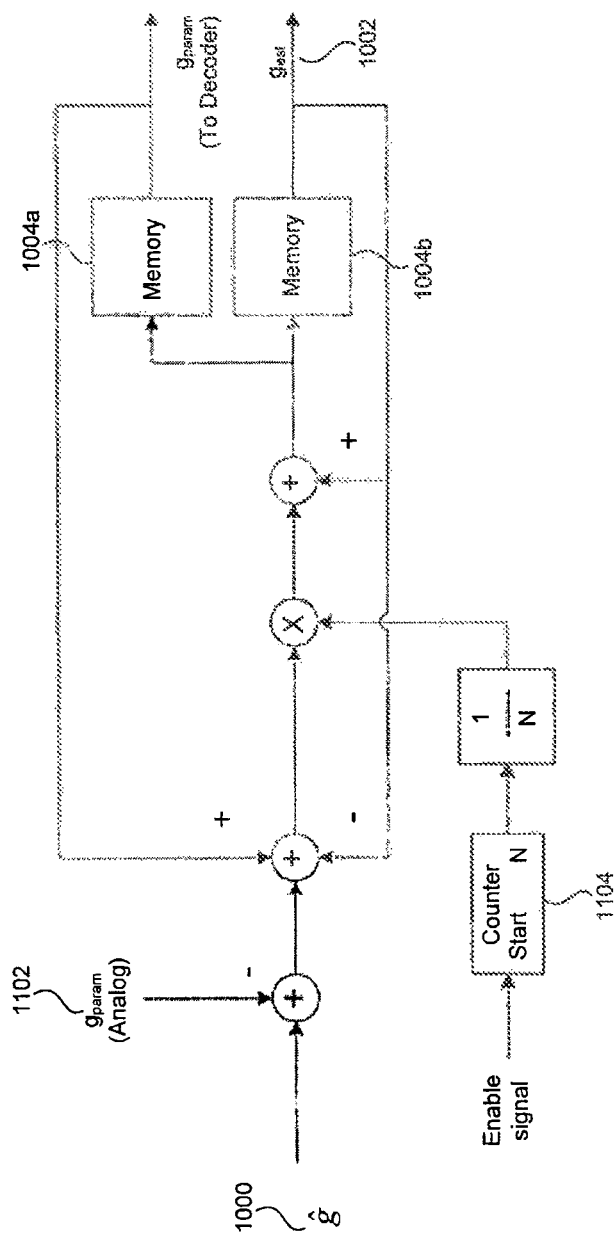
FIG. 11 is a block diagram illustrating power control parameter update in accordance with an embodiment of the disclosure.

FIG. 11 is a block diagram illustrating power control parameter update logic in accordance with an embodiment of the disclosure. The averaged gain estimates $g_{est}$ 1002 can be sampled and propagated to the analog section. In FIG. 11, the parameter $g_{param}$ 1102 represents the time sample value that $g_{est}$ 1102 propagated to the analog section. The equations given below can be utilized to determine the relationship between $g_{param}$ 1102 and $g_{est}$ 1002.

$$g_{est}[n] = \frac{1}{n}\sum_{i=1}^{n}\hat{g}[i] = g + \frac{1}{n}\sum_{i=1}^{n}e[i]$$

$$g_{est}[n-1] = \frac{1}{n-1}\sum_{i=1}^{n-1}\hat{g}[i] = g + \frac{1}{n-1}\sum_{i=1}^{n-1}e[i]$$

$$g_{param}[n-1] = \text{round}(g_{est}[n-1])$$

$$\hat{g}[n] = g + e[n] - g_{param}[n-1]$$

$$g + e[n] = \hat{g}[n] + g_{param}[n-1]$$

$$g_{est}[n] = \frac{(n-1)}{n}\cdot g_{est}[n-1] + \frac{1}{n}\cdot(g+e[n])$$

$$g_{est}[n] = \frac{(n-1)}{n}\cdot g_{est}[n-1] + \frac{1}{n}\cdot(\hat{g}_n + g_{param}[n-1])$$

$$g_{est}[n] = g_{est}[n-1] + \frac{1}{n}\cdot(\hat{g}[n] + g_{param}[n-1] - g_{est}[n-1])$$

In the equations given above, the value of n can be altered depending on the amount of confidence in the previous estimates. As shown in the above equations, the algorithm gives $(n-1)/n$ weighting to the previous estimate and a weight of $1/n$ to the current estimate. A value of $n=1$ will give 0 weighting to previous estimates, which is the equivalent of starting fresh. A counter 1104 keeps track of n as more estimates are accumulated. To facilitate a programmable confidence weight, the architecture allows for a preset value µ for this counter. This preset value can be changed prior to the start of the uplink frame when needed.

In various exemplary embodiments of the disclosure, there may be few known scenarios where the confidence value of the previous estimate may be determined a priori. Table 1 shows an exemplary list for cases supported. Each of these cases on the list can have a unique programmable confidence value.

TABLE 1

Confidence Value Table

| Transmitter use case | Default Preset-µ |
|---|---|
| Coldstart | 1 |
| TX power change | 1 |
| Low SNR mode | 20 |
| No Gain change mode | 20 |

In an exemplary embodiment of the disclosure, the confidence value as a function of time can be controlled dynamically or deterministically. Table 2 shows a scheme that can be used to switch between the two methods and dynamic control of the confidence value as a function of time.

TABLE 2

Estimate & Update qualification

| Conditions | | Estimate Update Control | | | |
|---|---|---|---|---|---|
| Cor Invalid | Det Invalid | Gain Loop | Phase Loop | Gain Mu | Phase Mu |
| 1 | x | freeze | freeze | freeze | freeze |
| 0 | 1 | approx | approx | update | update |
| 0 | 0 | accurate | accurate | update | update |

5. Methods

Figure 12:
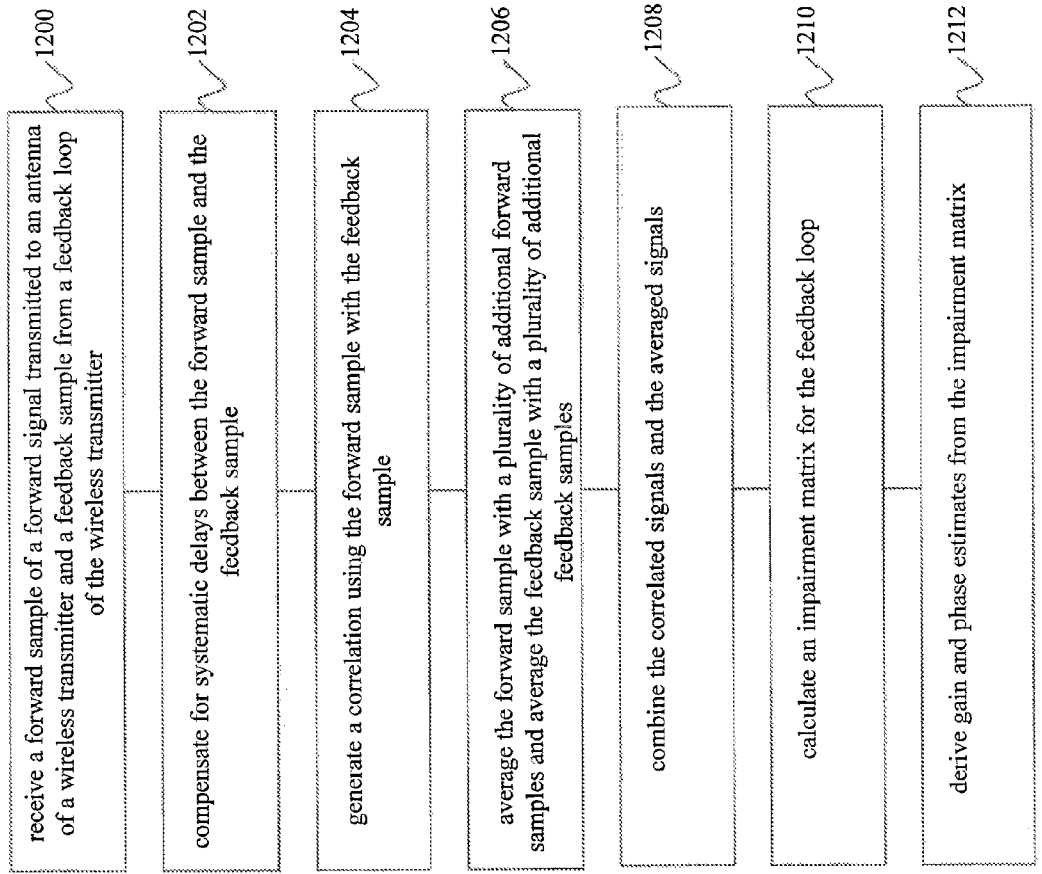
FIG. 12 is a flowchart of a method for computing gain and phase error estimates in accordance with an embodiment of the present disclosure.

FIG. 12 is a flowchart of a method for computing gain and phase error estimates in accordance with an embodiment of the present disclosure. In step 1200, a forward sample of a forward signal transmitted to an output port and a feedback sample from a feedback mechanism sampling the signal sent to the output port are received. For example, gain and phase controller 500 receives signals $I_{fwd}$ 200a, $Q_{fwd}$ 200b, $I_{fb}$ 201a, and $Q_{fb}$ 201b. In step 1202, compensation is performed for systematic delays between the forward sample and the feedback sample. For example, programmable delay element 601 can be used to compensate for any systematic delays caused by baseband or analog RF filters.

In step 1204, a correlation is generated using the forward sample and the feedback sample. For example, correlation module 602 generates correlation values cross-correlation matrix YTX and self-correlation matrix XTX using equations (3) and (4). In step 1206, the forward sample is averaged with a plurality of additional forward samples, and the feedback sample is averaged with a plurality of additional feedback samples. For example, mean module 604 generates mean matrices SY and SX by performing the operations given by equations (5) and (6) on samples of forward path signals X 503a and 503b and feedback path signals Y 501a and 501b. In step 1208, the correlated signals and the averaged signals are combined. For example, the outputs of correlation module 602 and mean module 604 are combined by combination module 606. In step 1210, an impairment matrix (e.g., one or more impairment values) for the feedback loop is calculated. For example, impairment computation module 608 computes an estimate $\hat{M}$ of impairment matrix M using the combined information from equations (7) and (8). In step 1212, gain and phase estimates are derived from the impairment matrix. For example, estimates for gain (g), and phase (φ) errors can be computed by parameter estimate computation module 610. This information can be used to generate gain and phase control signals 516 and 518.

Figure 13:
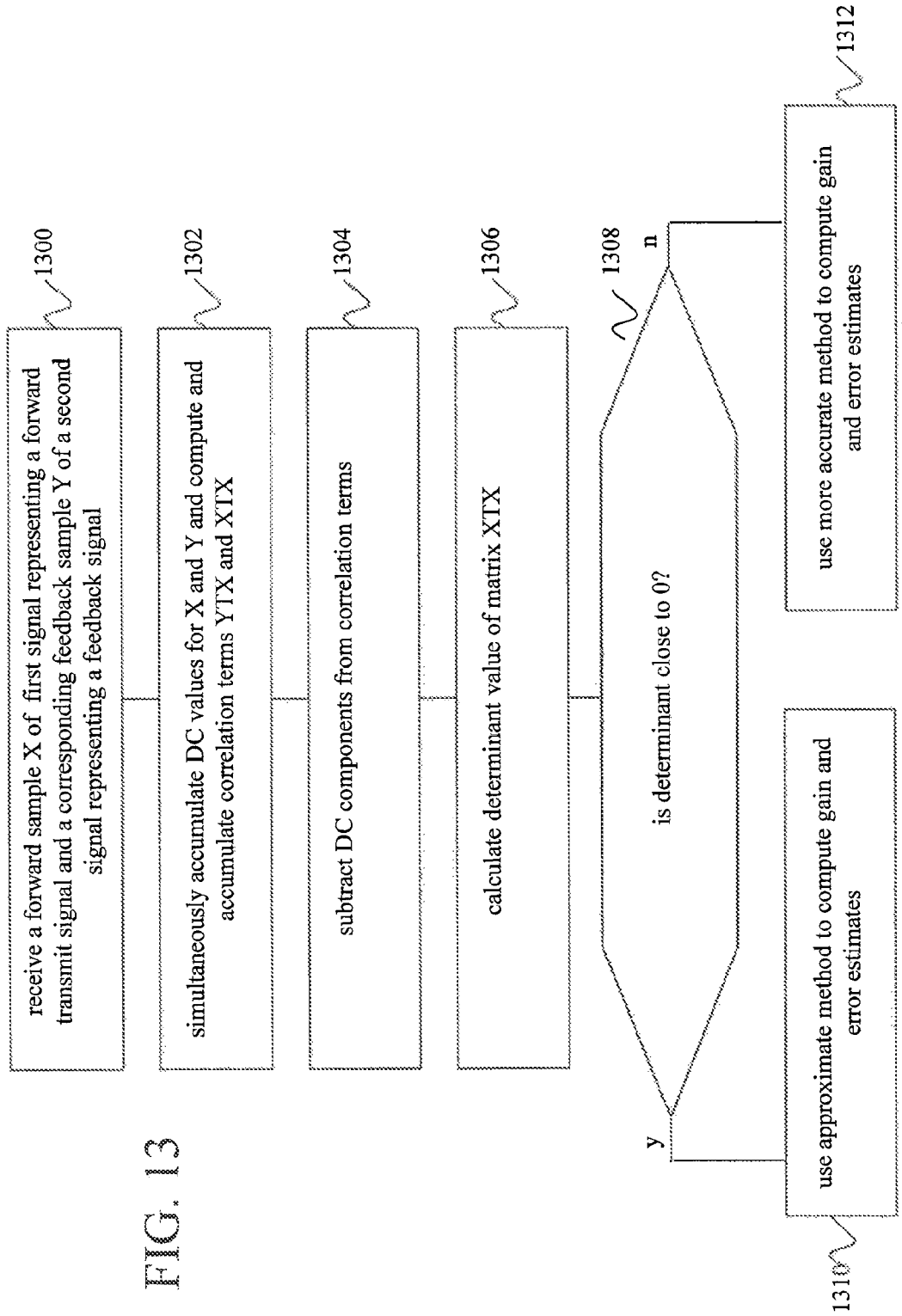
FIG. 13 is a flowchart of another method for computing gain and phase error estimates in accordance with an embodiment of the present disclosure.

FIG. 13 is a flowchart of another method for computing gain and phase error estimates in accordance with an embodiment of the present disclosure. In step 1300, a forward sample X of a forward signal transmitted to an output port and a feedback sample Y from a feedback loop sampling the signal sent to the output port are received. For example, gain and phase controller 500 receives signals $I_{fwd}$ 200a, $Q_{fwd}$ 200b, $I_{fb}$ 201a, and $Q_{fb}$ 201b. In step 1302, DC values for X and Y are accumulated, and correlation terms YTX and XTX are computed and accumulated simultaneously. For example, correlation module 602 generates correlation values for the samples while mean module 604 generates mean matrices for the samples. In step 1304, DC components are subtracted from correlation terms.

In step 1306, the determinant value of matrix XTX is calculated. In step 1308, the determinant is evaluated to determine whether it is close to zero. If the determinant is close to zero, the approximate method is used to compute gain and error estimates in step 1310. For example, digital gain and phase estimator 506 computes more accurate estimates for gain (g), phase ($\phi$), gain mismatch (gm) and quadrature ($\phi$) errors using equations (10) through (17). If the absolute value of the determinant is not much greater than zero, the more accurate method is used to compute gain and error estimates in step 1312. For example, digital gain and phase estimator 506 computes approximate estimates for gain (g) and phase ($\phi$) errors using equations (18) through (23). In an embodiment, the estimates can be accumulated for a more accurate estimate (e.g., using the integrator of FIG. 10). The gain and phase estimates can be continually updated as more estimates are accumulated. In an embodiment, estimates can be continually obtained for a predetermined period of time (e.g., during the first 50 µs of each transmit frame).

6. Advantages

Embodiments of the present disclosure provide several advantages. Embodiments of the present disclosure provide an gain and phase controller that can be used to provide fast and accurate closed loop power control for a wireless transmitter. The gain and phase controller provided by embodiments of the present disclosure uses a digital gain and phase estimator that jointly estimates both gain and phase. This gain and phase estimator enables a more streamlined implementation of the gain and phase controller into wireless transmitters.

Embodiments of the present disclosure provide the ability to estimate and correct transmit gain and phase within the cyclic prefix of an OFDM symbol. Additionally, gain and phase detection in accordance with embodiments of the present disclosure is independent of signal statistics. Further, algorithms are independent of transmit format. Averaging is used to reduce effects of quantizations and thermal noise. No averaging is necessary to establish a certain signal statistic such as exercising a significant portion of a cumulative distribution function (CCDF). Additionally, the large dynamic range of the feedback path provides for 60+dB of output power control. Embodiments of the present disclosure save time in factory calibration of the device due to the accurate design of steps in the feedback path.

6. Conclusion

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The representative signal processing functions described herein (e.g. channel and source decoders, etc.) can be implemented in hardware, software, or some combination thereof. For instance, the signal processing functions can be implemented using computer processors, computer logic, application specific circuits (ASIC), digital signal processors, etc., as will be understood by those skilled in the art based on the discussion given herein. Accordingly, any processor that performs the signal processing functions described herein is within the scope and spirit of the present invention.

The above systems and methods may be implemented as a computer program executing on a machine, as a computer program product, or as a tangible and/or non-transitory computer-readable medium having stored instructions. For example, the functions described herein could be embodied by computer program instructions that are executed by a computer processor or any one of the hardware devices listed above. The computer program instructions cause the processor to perform the signal processing functions described herein. The computer program instructions (e.g. software) can be stored in a tangible non-transitory computer usable medium, computer program medium, or any storage medium that can be accessed by a computer or processor. Such media include a memory device such as a RAM or ROM, or other type of computer storage medium such as a computer disk or CD ROM. Accordingly, any tangible non-transitory computer storage medium having computer program code that cause a processor to perform the signal processing functions described herein are within the scope and spirit of the present disclosure.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A wireless transmitter comprising:
an output port;
a feedback mechanism coupled to the output port, wherein the feedback mechanism is configured to generate a feedback signal; and
a controller configured to:
receive a forward sample of a forward signal transmitted to the output port, and
receive a feedback sample of the feedback signal from the feedback mechanism,
wherein the controller comprises an estimator, and wherein the estimator comprises:
a correlation module configured to correlate the forward sample and the feedback sample, and
an impairment computation module coupled to an output of the correlation module, wherein the impairment computation module is configured to:
compute an estimated gain error representing a difference in gain between the forward signal and the feedback signal, and
compute an estimated phase error representing a difference in phase between the forward signal and the feedback signal.

2. The wireless transmitter of claim 1, wherein the wireless transmitter further comprises:
   a power amplifier coupled to the output port; and
   a filter coupled to an input of the power amplifier.

3. The wireless transmitter of claim 2, wherein the controller is further configured to adjust a value of the power amplifier based on the estimated gain error.

4. The wireless transmitter of claim 2, wherein the controller is further configured to adjust the wireless transmitter based on the estimated phase error.

5. The wireless transmitter of claim 1, further comprising a programmable delay element coupled to an input of the correlation module and a mean module.

6. The wireless transmitter of claim 1, wherein the estimator further comprises:
   a mean module configured to receive the forward sample and the feedback sample; and
   a combination module coupled to the output of the correlation module, an output of the mean module, and an input of the impairment computation module.

7. The wireless transmitter of claim 1, further comprising:
   a directional coupler coupled to the output port, wherein the directional coupler is configured to obtain the feedback sample;
   a feedback attenuator coupled to the directional coupler; and
   a mixer coupled to an output of the feedback attenuator, wherein the mixer is configured to provide an input to the controller.

8. The wireless transmitter of claim 1, wherein the wireless transmitter includes a Cartesian Feedback Loop (CFL).

9. A controller comprising:
   a correlation module configured to:
      correlate a forward sample of a forward signal transmitted to an output port of a wireless transmitter, and
      correlate a feedback sample of a feedback signal generated by a feedback mechanism of the wireless transmitter;
   a mean module configured to receive the forward sample and the feedback sample; and
   an impairment computation module coupled to an output of the correlation module, wherein the impairment computation module is configured to compute estimated impairments introduced into a feedback loop of a host circuit coupled to the controller, and wherein the estimated impairments include an estimated phase error representing a difference in phase between the forward signal and the feedback signal.

10. The controller of claim 9, wherein the correlation module is further configured to compute a cross-correlation between the feedback sample and the forward sample.

11. A controller comprising:
   a correlation module configured to receive a forward sample of a forward signal transmitted to an output port of a wireless transmitter and a feedback sample from a feedback mechanism of the wireless transmitter;
   a mean module configured to receive the forward sample and the feedback sample;
   a combination module coupled to an output of the correlation module and to an output of the mean module, wherein the combination module is configured to combine information output from the mean module and the correlation module; and
   an impairment computation module coupled to an output of the combination module, wherein the impairment computation module is configured to compute an estimated impairment value representing impairments introduced into a feedback loop of a host circuit coupled to the controller.

12. The controller of claim 9, further comprising a parameter estimate computation module coupled to an output of the impairment computation module, wherein the parameter estimate computation module is configured to compute an estimated gain error and the estimated phase error based on the estimated impairments, and wherein the controller is configured to adjust the wireless transmitter based on the estimated gain error and the estimated phase error.

13. The controller of claim 12, wherein the parameter estimate computation module is further configured to compute a gain mismatch error and a quadrature error.

14. The controller of claim 12, wherein the controller is further configured to select either an accurate method for computing the estimated gain error and the estimated phase error or an approximate method for computing the estimated gain error and the estimated phase error.

15. The controller of claim 14, wherein the controller is further configured to select either the accurate method or the approximate method based on a determinant value of a self-correlation matrix computed from the forward sample.

16. A method comprising:
   receiving a forward sample of a forward signal transmitted to an output port of a wireless transmitter;
   receiving a feedback sample of a feedback signal from a feedback mechanism of the wireless transmitter;
   correlating, using a correlation module, the forward sample and the feedback sample to generate correlated data;
   computing, based on the correlated data, estimated impairments introduced into a feedback loop of a host circuit, wherein the estimated impairments include:
      an estimated gain error representing a difference in gain between the forward signal and the feedback signal, and
      an estimated phase error representing a difference in phase between the forward signal and the feedback signal; and
   adjusting the feedback loop based on the estimated impairments.

17. The method of claim 16, further comprising:
   calculating a cross-correlation result between the forward sample and the feedback sample; and
   calculating a self-correlation result using the forward sample.

18. The method of claim 17, further comprising:
   subtracting a first direct current (DC) offset component of the cross-correlation result; and
   subtracting a second direct current (DC) offset component of the self-correlation result.

19. The method of claim 17, further comprising:
   computing a determinant of the self-correlation result; and
   selecting an accurate method for computing the estimated impairments or an approximate method for computing the estimated impairments based on the determinant.

20. The method of claim 16, further comprising:
   averaging the forward sample with a plurality of additional forward samples; and
   averaging the feedback sample with a plurality of additional feedback samples.

21. The method of claim 16, further comprising:
   computing an estimated impairment matrix to compute the estimated impairments.

22. The wireless transmitter of claim 1, wherein the estimator is a digital gain and phase estimator configured to jointly compute the estimated gain error and the estimated phase error.

* * * * *